US012656393B2

(12) United States Patent
Chouaib et al.

(10) Patent No.: US 12,656,393 B2
(45) Date of Patent: Jun. 16, 2026

(54) METHODS AND SYSTEMS FOR MEASUREMENT OF SEMICONDUCTOR STRUCTURES BASED ON DERIVATIVE MEASUREMENT SIGNALS

(71) Applicant: KLA Corporation, Milpitas, CA (US)

(72) Inventors: Houssam Chouaib, Milpitas, CA (US); Zhengquan Tan, Cupertino, CA (US); Derrick Shaughnessy, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 222 days.

(21) Appl. No.: 18/210,547

(22) Filed: Jun. 15, 2023

(65) Prior Publication Data
US 2024/0151770 A1 May 9, 2024

Related U.S. Application Data

(60) Provisional application No. 63/420,087, filed on Oct. 28, 2022.

(51) Int. Cl.
*G01R 31/308* (2006.01)

(52) U.S. Cl.
CPC .................................. *G01R 31/308* (2013.01)

(58) Field of Classification Search
CPC ........ G01N 21/63; G01N 21/88; G01N 21/95; G01R 19/00; G01R 22/06; G01R 31/2656; G01R 31/308; H01L 21/66
See application file for complete search history.

(56) References Cited

U.S. PATENT DOCUMENTS 4,652,757 A * 3/1987 Carver ............... G01N 21/1717
250/341.4
5,608,526 A 3/1997 Piwonka-Corle et al.
(Continued)

FOREIGN PATENT DOCUMENTS

CN 103134592 A 6/2013
CN 109580551 A 4/2019
(Continued)

OTHER PUBLICATIONS

Lemaillet, Germer, Kline et al.,"Intercomparison between optical and x-ray scatterometry measurements of FinFET structures" by Proc. SPIE, v.8681, p. 86810Q (2013).
(Continued)

*Primary Examiner* — Eman A Alkafawi
*Assistant Examiner* — Courtney G McDonnough
(74) *Attorney, Agent, or Firm* — Spano Law Group

(57) ABSTRACT

Methods and systems measuring structural parameters characterizing a measurement target based on changes in measurement signal values and estimated changes in electrical properties, optical properties, or both, of the measurement target due to perturbation of the properties are presented herein. The electrical and optical properties of a measurement target are perturbed by inducing changes in an electric field within the measurement target under measurement. In preferred embodiments, the changes in the electric field are induced by directing a modulated beam of illumination light at the measurement target under measurement. Both the changes in the measurement signal values and estimated changes in the electrical, properties, optical properties, or both, of the measurement target are quantified and provided as input to a measurement model. In this manner, the measurement is based on the derivatives of measurement
(Continued)

signals with respect to electrical properties, optical properties, or both.

20 Claims, 5 Drawing Sheets

(56)                References Cited

U.S. PATENT DOCUMENTS

| | | | |
|---|---|---|---|
| 5,859,424 | A | 1/1999 | Norton et al. |
| 6,023,338 | A | 2/2000 | Bareket |
| 6,268,916 | B1 | 7/2001 | Lee et al. |
| 6,429,943 | B1 | 8/2002 | Opsal et al. |
| 6,716,646 | B1 | 4/2004 | Wright et al. |
| 6,778,275 | B2 | 8/2004 | Bowes |
| 6,787,773 | B1 | 9/2004 | Lee |
| 6,952,261 | B2 | 10/2005 | Ebert |
| 6,963,402 | B2 | 11/2005 | Chism, II |
| 6,992,764 | B1 | 1/2006 | Yang et al. |
| 7,016,044 | B2 | 3/2006 | Murtagh et al. |
| 7,212,288 | B2 | 5/2007 | Opsal et al. |
| 7,239,392 | B2 | 7/2007 | Chism, II |
| 7,242,477 | B2 | 7/2007 | Mieher et al. |
| 7,280,215 | B2 | 10/2007 | Salnik et al. |
| 7,321,426 | B1 | 1/2008 | Poslavsky et al. |
| 7,406,153 | B2 | 7/2008 | Berman |
| 7,423,757 | B2 | 9/2008 | Nicolaides et al. |
| 7,453,562 | B1 | 11/2008 | Kaack et al. |
| 7,478,019 | B2 | 1/2009 | Zangooie et al. |
| 7,502,104 | B2 | 3/2009 | Salnik et al. |
| 7,616,308 | B2 | 11/2009 | Murtagh et al. |
| 7,626,702 | B2 | 12/2009 | Ausschnitt et al. |
| 7,656,528 | B2 | 2/2010 | Abdulhalim et al. |
| 7,659,979 | B2 | 2/2010 | Murtagh et al. |
| 7,826,071 | B2 | 11/2010 | Shchegrov et al. |
| 7,842,933 | B2 | 11/2010 | Shur et al. |
| 7,847,937 | B1 | 12/2010 | Bevis |
| 7,873,585 | B2 | 1/2011 | Izikson |
| 7,929,667 | B1 | 4/2011 | Zhuang et al. |
| 7,933,026 | B2 | 4/2011 | Opsal et al. |
| 8,068,662 | B2 | 11/2011 | Zhang et al. |
| 8,138,498 | B2 | 3/2012 | Ghinovker |
| 8,300,227 | B2 | 10/2012 | Chism, II |
| 8,817,260 | B2 | 8/2014 | Opsal et al. |
| 9,291,554 | B2 | 3/2016 | Kuznetsov et al. |
| 9,405,290 | B1 | 8/2016 | Malkova et al. |
| 9,826,614 | B1 | 11/2017 | Bakeman et al. |
| 9,885,962 | B2 | 2/2018 | Veldman et al. |
| 9,915,522 | B1 | 3/2018 | Jiang et al. |
| 10,013,518 | B2 | 7/2018 | Bakeman et al. |
| 10,101,670 | B2 | 10/2018 | Pandev et al. |
| 10,152,678 | B2 | 12/2018 | Pandev et al. |
| 10,324,050 | B2 | 6/2019 | Hench et al. |
| 10,352,695 | B2 | 7/2019 | Dziura et al. |
| 10,458,912 | B2 | 10/2019 | Chouaib et al. |
| 10,545,104 | B2 | 1/2020 | Hench et al. |
| 10,775,323 | B2 | 9/2020 | Gellineau et al. |
| 10,794,839 | B2 | 10/2020 | Rosenberg et al. |
| 11,036,898 | B2 | 6/2021 | Chouaib et al. |
| 11,156,548 | B2 | 10/2021 | Nguyen et al. |
| 11,555,689 | B2 | 1/2023 | Chouaib et al. |
| 11,573,077 | B2 | 2/2023 | Chouaib et al. |
| 2003/0021465 | A1 | 1/2003 | Adel et al. |
| 2003/0085730 | A1* | 5/2003 | Borden .............. G01N 21/1717 257/E21.53 |
| 2007/0176128 | A1 | 8/2007 | Van Bilsen et al. |
| 2007/0221842 | A1 | 9/2007 | Morokuma et al. |
| 2009/0033931 | A1 | 2/2009 | Murtagh et al. |
| 2009/0152463 | A1 | 6/2009 | Toyoda et al. |
| 2010/0134785 | A1 | 6/2010 | Opsal et al. |
| 2010/0315625 | A1 | 12/2010 | Salnik et al. |
| 2011/0266440 | A1 | 11/2011 | Boughorbel et al. |
| 2012/0292502 | A1 | 11/2012 | Langer et al. |
| 2013/0003050 | A1* | 1/2013 | Zhu ................... G01N 21/1717 356/73 |
| 2013/0169966 | A1 | 7/2013 | Shchegrov et al. |
| 2013/0208279 | A1 | 8/2013 | Smith |
| 2013/0304424 | A1 | 11/2013 | Bakeman et al. |
| 2014/0019097 | A1 | 1/2014 | Bakeman et al. |
| 2014/0064445 | A1 | 3/2014 | Adler |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2014/0297211 | A1 | 10/2014 | Pandev et al. |
| 2014/0316730 | A1 | 10/2014 | Shchegrov et al. |
| 2015/0046118 | A1 | 2/2015 | Pandev et al. |
| 2015/0046121 | A1 | 2/2015 | Dziura et al. |
| 2015/0110249 | A1 | 4/2015 | Bakeman et al. |
| 2015/0117610 | A1 | 4/2015 | Veldman et al. |
| 2015/0204664 | A1 | 7/2015 | Bringoltz et al. |
| 2015/0285749 | A1 | 10/2015 | Moncton et al. |
| 2015/0300965 | A1 | 10/2015 | Sezginer et al. |
| 2016/0109375 | A1 | 4/2016 | Pandev et al. |
| 2016/0141193 | A1 | 5/2016 | Pandev et al. |
| 2016/0202193 | A1 | 7/2016 | Hench et al. |
| 2016/0282105 | A1 | 9/2016 | Pandev |
| 2016/0320319 | A1 | 11/2016 | Hench et al. |
| 2017/0016815 | A1 | 1/2017 | Shchegrov et al. |
| 2017/0167862 | A1 | 6/2017 | Dziura et al. |
| 2018/0106735 | A1 | 4/2018 | Gellineau et al. |
| 2018/0113084 | A1 | 4/2018 | Hench et al. |
| 2018/0328868 | A1 | 11/2018 | Bykanov et al. |
| 2019/0017946 | A1 | 1/2019 | Wack et al. |
| 2019/0195782 | A1 | 6/2019 | Shchegrov et al. |
| 2019/0293578 | A1 | 9/2019 | Gellineau |
| 2021/0207956 | A1 | 7/2021 | Shchegrov et al. |
| 2021/0223166 | A1 | 7/2021 | Shchegrov et al. |
| 2021/0293532 | A1 | 9/2021 | Chouaib et al. |
| 2023/0109008 | A1 | 4/2023 | McGahan et al. |
| 2023/0253180 | A1 | 8/2023 | Bizen et al. |
| 2023/0273253 | A1 | 8/2023 | Shirasaki et al. |
| 2023/0274909 | A1 | 8/2023 | Shouji et al. |
| 2023/0377837 | A1 | 11/2023 | Nakamura et al. |

FOREIGN PATENT DOCUMENTS

| | | |
|---|---|---|
| CN | 11026131 B | 11/2021 |
| EP | 2631635 A1 | 8/2013 |
| IE | 20030890 A1 | 6/2004 |
| IE | 20030892 A1 | 6/2004 |
| WO | 2003025551 A1 | 3/2003 |
| WO | 2015030343 A1 | 3/2015 |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).

Yu, Jin, et al., "Photoluminescence spectra of point defects in semiconductors: validation of first principles calculations" https://arxiv.org/abs/2106.08608 (2021).

Price, J., et al., "Identification of sub-band-gap absorption features at the HfO2/Si(100) interface via spectroscopic ellipsometry," Applied Physics Letters 91, 061925 (2007).

Price, J., et al., "Identification of interfacial defects in high-k gate stack films by spectroscopic ellipsometry," Vac. Sci. Tecnol. B 27 (1), 310 (2009).

International Search Report mailed on Feb. 14, 2024, for PCT Application No. PCT/US2023/035560. Filed on Oct. 20, 2023 by KLA Corporation, 3 pages.

* cited by examiner

11

10    Si₃N₄

25

21    Si₃N₄

22    SiO₂

23    Si₃N₄

24    SiO₂

SI SUBSTRATE
20

METHODS AND SYSTEMS FOR MEASUREMENT OF SEMICONDUCTOR STRUCTURES BASED ON DERIVATIVE MEASUREMENT SIGNALS

CROSS REFERENCE TO RELATED APPLICATION

The present application for patent claims priority under 35 U.S.C. § 119 from U.S. provisional patent application Ser. No. 63/420,087, entitled "Apparatus and Method for Acquiring the Mueller Matrix Derivatives and Modulated Ellipsometry Spectra from a Semiconductor Specimen," filed Oct. 28, 2022, the subject matter of which is incorporated herein by reference in its entirety.

TECHNICAL FIELD

The described embodiments relate to metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical and x-ray based metrology techniques offer the potential for high throughput without the risk of sample destruction. A number of techniques including scatterometry, ellipsometry, and reflectometry implementations and associated analysis algorithms are commonly used to characterize critical dimensions, film thicknesses, composition, overlay, and other parameters of nanoscale structures.

As devices (e.g., logic and memory devices) move toward smaller nanometer-scale dimensions, characterization becomes more difficult. Devices incorporating complex three-dimensional geometry and materials with diverse physical properties contribute to characterization difficulty. In some examples, semiconductor devices are increasingly valued based on their energy efficiency, rather than speed alone. For example, energy efficient consumer products are more valuable because they operate at lower temperatures and for longer periods of time on a fixed battery power supply. In another example, energy efficient data servers are in demand to reduce their operating costs. As a result, there is a strong interest to reduce the energy consumption of semiconductor devices. Solutions include the use of high-K material layers and complex geometric structures, both of which contribute to characterization difficulty.

Modern semiconductor processes are employed to produce complex structures. A complex measurement model with multiple parameters is required to represent these structures and account for process and dimensional variations. Complex, multiple parameter models include modeling errors induced by parameter correlations and low measurement sensitivity to some parameters. In addition, regression of complex, multiple parameter models having a relatively large number of floating parameter values may not be computationally tractable.

In some examples, a number of parameters are typically fixed in a model-based measurement to reduce the impact of these error sources and reduce computational effort. Although fixing the values of a number of parameters may improve calculation speed and reduce the impact of parameter correlations, it also leads to errors in the estimates of parameter values.

In some other examples, measurements are performed while the local environment around a metrology target under measurement is treated with a flow of purge gas that includes a controlled amount of fill material. A portion of the fill material condenses onto the structures under measurement and fills openings in the structural features, openings between structural features, etc. The presence of the fill material changes the optical properties of the structure under measurement compared to a measurement scenario where the purge gas is devoid of any fill material. Model based measurements are performed with an enriched data set including measurement signals collected from the metrology target having geometric features filled with fill material. This reduces parameter correlation among floating measurement parameters and improves measurement accuracy. In this manner, model-based measurement results can be obtained with reduced computational effort. Further details are described in U.S. Pat. No. 10,145,674 assigned to KLA-Tencor Corporation, Milpitas, California, the contents of which are incorporated herein by reference in their entirety. Unfortunately, applying a fill material to a wafer introduces problems with contamination of the wafer itself, limited contrast induced by the fill material, lack of flexibility in the selection of the fill material, increased system complexity, and increased risk due to contact with the wafer surface.

Other measurement examples include various forms of modulation spectroscopy, e.g., photo-modulated reflectivity and electroreflectance spectroscopy, in which periodic changes are induced in the electric field of the sample under test. The modulation of the electric field effectively causes a modulation of the dielectric function of the sample materials at the same frequency. The measured signal is typically expressed as the change in reflectivity, $\Delta R$, divided by the nominal reflectivity, $R$. The measurement signal, $\Delta R/R$, exhibits features associated with various electronic transitions in the sample materials. In one example, the measurement signal, $\Delta R/R$, is highly sensitive to the band structure of the sample materials.

In some existing systems, reflectometry measurements are performed while modulating the intensity of a pump beam delivered to a measurement site.

Measurements of light reflected or scattered from the sample in response to a probe beam are performed while the pump beam illuminates the measurement site. In some examples, the pump beam and the probe beam are the same beams. The modulated pump beam induces a change in the electric field in the sample, which in turn, modulates the reflectivity of the sample under measurement. In some of these examples, the line shape of the measured changes in reflectivity, e.g., $\Delta R/R$, is examined directly to determined values of parameters of interest, e.g., band gap. In some other examples, a measurement model is employed to determine values of parameters of interest based on the measured changes in reflectivity, e.g., $\Delta R/R$.

In existing systems, the induced changes in internal optical properties of the measurement target due to the modulated pump beam are not quantified and provided as input to a measurement model. Rather, measurement results are derived solely from changes in observed optical properties, e.g., reflectivity. This approach limits the range of parameters of interest that may be measured based on modulated reflectivity data.

Currently, the solution of complex, multiple parameter measurement models often requires an unsatisfactory compromise. Current model reduction techniques are sometimes unable to arrive at a measurement model that is both computationally tractable and sufficiently accurate. Moreover, complex, multiple parameter models make it difficult, or impossible, to optimize system parameter selections (e.g., wavelengths, angles of incidence, etc.) for each parameter of interest.

Future metrology applications present challenges due to increasingly small resolution requirements, multi-parameter correlation, increasingly complex geometric structures, and increasing use of opaque materials. Accordingly, it would be advantageous to develop high throughput systems and methods for characterizing complex semiconductor structures, e.g., structures incorporating high-k dielectric layers. In particular, it would be advantageous to develop a robust, reliable, and stable approach to in-line metrology of gate stacks including high-k dielectrics. Thus, methods and systems for improved measurements of semiconductor structures are desired.

SUMMARY

Methods and systems measuring structural parameters characterizing a measurement target based on changes in measurement signal values and estimated changes in electrical properties, optical properties, or both, of the measurement target due to perturbation of the properties are presented herein. The electrical and optical properties of a measurement target are perturbed by inducing changes in an electric field within the measurement target under measurement.

In preferred embodiments, the changes in the electric field are induced by directing a modulated beam of illumination light at the measurement target under measurement. The perturbation of the electrical and optical properties of the measurement target induces changes in the measurement signal values. Both the changes in the measurement signal values and estimated changes in the electrical, properties, optical properties, or both, of the measurement target are quantified and provided as input to a measurement model. In this manner, the measurement is based on the derivatives of measurement signals with respect to electrical properties, optical properties, or both. In some examples, measurements based on these derivative quantities enable increased sensitivity to film and CD parameters with reduced correlations among the parameters characterizing different materials comprising the structure under measurement.

The methods and systems described herein are applicable to a wide range of contactless and non-destructive measurement systems, e.g., optical, electron-based, and x-ray based measurement systems, operating in any number of signal modalities, e.g., reflectometry, ellipsometry, scatterometry, pupil imagery, field imagery, hyperspectral imagery, etc.

In preferred embodiments, a tunable, laser based illumination source generates a modulated illumination beam having selected beam energy directed to a measurement target. In one aspect, the beam energy of the modulated illumination beam is selected to break correlations among different materials comprising the structure under measurement. In some examples, different material layers have very low optical contrast, but significant contrast in electrical properties, e.g., bandgap. In these examples, the photon energy of the modulated illumination beam is selected to lie between the bandgaps of two different material layers of a multi-layer stack.

In general, the illumination power of illumination light incident at a measurement spot may vary between different illumination power levels in any periodic or non-periodic manner. In some examples, the illumination light is varied in a binary manner, e.g., on/off, in accordance with a sinusoid between different illumination power levels, in accordance with a square wave between different illumination power levels, etc.

In some examples, the changes in the electrical, properties, optical properties, or both, of the measurement target are estimated based on separate measurements of single layer film samples. The electrical properties, optical properties, or both, of each single layer film sample are measured without pump illumination light and with pump illumination light at specified beam energy and beam power density levels. The difference in measured properties is the induced change in electrical properties, optical properties, or both, associated with the specified beam energy and beam power density levels. In some embodiments, the single layer film samples are located on the same wafer as the measurement target. In some other embodiments, the single layer film samples are located on other wafers.

The methods and systems described herein enable improved measurements of structural elements common in semiconductor manufacturing, e.g., material composition, alloy fraction measurements of compound semiconductors, material band gap, characterization of semiconductor surfaces and interfaces, film layer properties, critical dimensions, etc. Measurement applications include measurements of structural elements comprising complex semiconductor structures such as 3D VNAND structures and Gate-All-Around (GAA) structures, including front-end-of-line (FEOL) layers from oxide definition layers to high-k metal gate (HKMG) stacks. Measurement applications include measurements of structural elements comprised of semiconducting materials, insulating dielectric materials, and conducting materials, including organic materials, inorganic materials, or a combination thereof.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1:
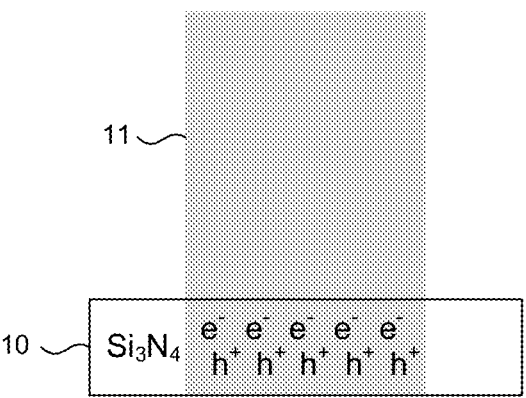
FIG. 1 is a diagram illustrative of a silicon nitride sample 10 illuminated by a beam 11 of illumination light having a photon energy greater than the bandgap of the silicon nitride material.

Reference will now be made in detail to background examples and some embodiments of the invention, examples of which are illustrated in the accompanying drawings.

Methods and systems for modulating electrical and optical properties of a measurement target and measuring structural parameters characterizing the measurement target based on changes in measurement signal values and estimated changes in electrical properties, optical properties, or both, of the measurement target are presented herein.

The electrical and optical properties of a measurement target are perturbed by inducing changes in an electric field within the measurement target under measurement. In preferred embodiments, the changes in the electric field are induced by directing a modulated beam of illumination light at the measurement target under measurement. The perturbation of the electrical and optical properties of the measurement target induces changes in the measurement signal values. Both the changes in the measurement signal values and the electrical, properties, optical properties, or both, are quantified and provided as input to a measurement model. In this manner, the measurement is based on the derivatives of measurement signals with respect to electrical properties, e.g., electron density, or optical properties, e.g., optical dispersion, or both. In some examples, measurements based on these derivative quantities enable increased sensitivity to film and CD parameters with reduced correlations among the parameters characterizing different materials comprising the structure under measurement.

The measurement model estimates values of one or more parameters of interest characterizing one or more structural elements of the measurement target based on both the changes in measurement signal values and changes in the electrical properties, optical properties, or both. In this manner, the measurement model operates on derivative information, i.e., changes in measurement signals as a function of changes in electrical properties, optical properties, or both, to estimate values of one or more parameters of interest.

The methods and systems described herein are applicable to a wide range of contactless and non-destructive measurement systems, e.g., optical, electron-based, and x-ray based measurement systems, operating in any number of signal modalities, e.g., reflectometry, ellipsometry, scatterometry, pupil imagery, field imagery, hyperspectral imagery, etc. Model based measurements performed based on derivative information as described herein breaks correlations and provides sensitivity to structural parameters that would not otherwise be accessible by contactless and non-destructive measurement systems.

Generally, changes in both electrical and optical properties of a semiconductor material are induced by illumination light incident on the material. The incident illumination light generates electron-hole pairs in a semiconductor material when the material is subjected to illumination light with photon energy above the band gap of the material. The electron-hole pairs induce a plasma current, thermal effects, or both, which, in turn, change the optical properties of the material, e.g., refractive index, n, and absorption coefficient, k. The degree to which electrical and optical properties are changed by illumination light depends on the photon energy and power density of the incident illumination light and the material itself. In some embodiments, measurements are performed using different wavelengths, power density, or both, to further break correlations and increase measurement sensitivity.

FIG. 1 is a diagram illustrative of a silicon nitride sample 10 illuminated by a beam 11 of illumination light having a photon energy greater than the bandgap of the silicon nitride material. As depicted in FIG. 1, the illumination light 11 is absorbed by the silicon nitride 10 and electron-hole pairs are generated in the material. The electron-hole pairs change the electrical properties of the material. Furthermore, the electron-hole pairs induce plasma current and thermal effects, which, in turn, change the optical properties of the material, e.g., refractive index, n, and absorption coefficient, k. Equations (1) and (2) illustrate the refractive index and absorption coefficient of the silicon nitride material 10 under illumination light 11, where $n_0$ is the nominal value of the refractive index when illumination light 11 is not present and $\Delta n$ is the change in value of the refractive index due to illumination light 11. Similarly, $k_0$ is the nominal value of the absorption coefficient when illumination light 11 is not present and $\Delta k$ is the change in value of the absorption coefficient due to illumination light 11.

$$n(\lambda)=n_0(\lambda)+\Delta n(\lambda) \qquad (1)$$

$$k(\lambda)=k_0(\lambda)+\Delta k(\lambda) \qquad (2)$$

In some examples, the change in value of the refractive index is significant and measurements performed with illumination light 11 and without illumination light 11 will result in two different measured signals. In these examples, the difference between the two different measured signals provides derivative information, i.e., changes in measurement signals as a function of changes in optical properties.

The electrical and optical properties of a semiconductor material are modulated by modulating the power of the illumination light incident on the semiconductor material. The modulation of the illumination power can be binary, e.g., on/off, sinusoidal, or any other suitable change in illumination power over time. In some embodiments, the modulation is achieved by electrically controlling the illumination power output of the illumination source. In some other embodiments, the modulation is achieved by mechanically blocking or otherwise diverting the illumination light to control the illumination power incident on the structure under measurement, e.g., using a chopper.

In some embodiments, a laser based illumination source generates a modulated illumination beam directed to a measurement target to modulate the electrical and optical properties of a structure under measurement. In some embodiments, the illumination beam is a single wavelength beam. In other embodiments, the illumination beam is a broadband illumination beam.

In one aspect, the beam energy, i.e., wavelength, of the modulated illumination beam is selected to break correlations among different materials comprising the structure under measurement. In preferred embodiments, a tunable, laser based illumination source generates a modulated illumination beam having selected beam energy directed to a measurement target.

In some examples, modulation based measurements of multi-layer stacks of different material layers are performed. In some of these examples, the different material layers have very low optical contrast, but significant contrast in electrical properties, e.g., bandgap. In these examples, the photon energy of the modulated illumination beam is selected to lie between the bandgaps of two different material layers of a multi-layer stack.

By modulating the pump beam at a photon energy above the bandgap of one material, that particular material absorbs the pump light, and the measurement signal includes a modulated signal component from that material layer. Moreover, by modulating the pump beam at a photon energy below the bandgap of another material of the multi-layer stack, that particular material does not absorb the pump light, and the measurement signal does not include a modulated component from that material layer. In these embodiments, the different materials may not offer significant optical contrast, but the contrast in electronic properties, e.g., bandgap, is exploited by selection of the photon energy of the pump beam to decouple the different materials in the measurement signal. More specifically, the difference between measured signals while the multi-layer stack is illuminated by the pump light and measured signals while the multi-layer stack is not illuminated by the pump light will cause the contribution of the non-absorbing material to drop out, leaving a difference signal that depends on the absorbing layer only. In this manner, the difference signal effectively decouples the non-absorbing material layers from the measurement.

Figure 2:
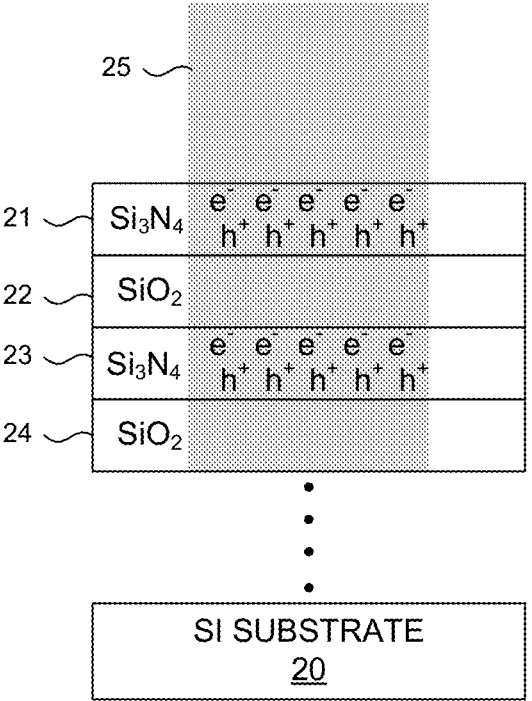
FIG. 2 is a diagram illustrative of a multi-layer material stack disposed on a silicon substrate illuminated by a beam of illumination light having a photon energy greater than the bandgap of one of the stack materials and less than the bandgap of another of the stack materials.

FIG. 2 is a diagram illustrative of a multi-layer material stack disposed on a silicon substrate illuminated by a beam of illumination light having a photon energy greater than the bandgap of one of the stack materials and less than the bandgap of another of the stack materials.

As depicted in FIG. 2, a multi-layer material stack includes alternating layers 22 and 24 of silicon oxide ($SiO_2$) and layers 21 and 23 of silicon nitride ($Si_3N_4$) disposed on a silicon substrate 20. This type of thin film stack is commonly referred to as an Oxide/Nitride/Oxide (ONO) film stack. In some embodiments, each of the silicon nitride and silicon oxide layers are very thin, e.g., each layer has a thickness of approximately five nanometers. The optical properties of $SiO_2$ and $Si_3N_4$ are very similar and this leads to high correlation among the thickness, profile, and CD parameters characterizing stacked structures fabricated using both materials when optical based measurement tools are employed.

Although the optical contrast between $SiO_2$ and $Si_3N_4$ layers is very low, the electrical contrast between the two materials is significant, i.e., their electrical properties are quite different. For example, the bandgap of $SiO_2$ is approximately 9 eV and the bandgap of $Si_3N_4$ is approximately 5 eV. The multi-layer material stack is illuminated by a beam 25 of illumination light having photon energy greater than the bandgap of the silicon nitride material and less than the bandgap of the silicon oxide material, e.g., photon energy is approximately 7 eV. In this example, the illumination light is only absorbed by the $Si_3N_4$ layers. This generates electron-hole pairs in the $Si_3N_4$ layers, but not the $SiO_2$ layers. The electron-hole pairs induce plasma current and thermal effects, which, in turn, change the optical properties of the $Si_3N_4$ layers, but not the $SiO_2$ layers. Thus, the illumination beam 25 perturbs the optical properties of the $Si_3N_4$ layers, but not the $SiO_2$ layers.

Furthermore, the difference between optical measurements performed with illumination light 11 and without illumination light 11 will have practically no contribution from the $SiO_2$ material layers and significant contribution from the $Si_3N_4$ material layers. In this example, the difference between the two different measured signals provides derivative information, i.e., changes in measurement signals as a function of changes in optical properties, where the derivative is close to null for the $SiO_2$ material layers and non-zero for the $Si_3N_4$ material layers. In general, a wide number of derivative spectra can be generated by varying the pump beam wavelength.

Figure 3:
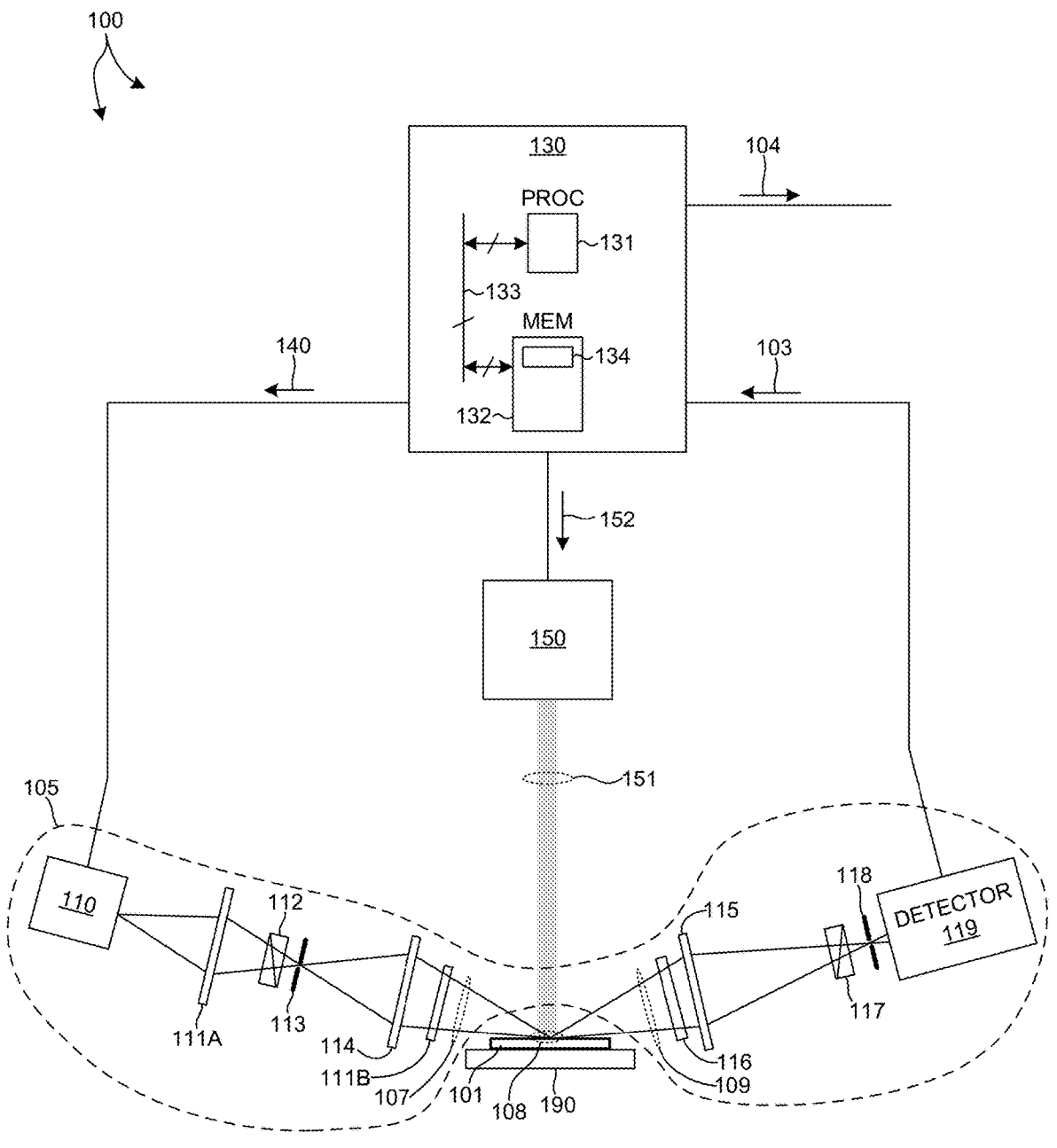
FIG. 3 is a diagram illustrative of a spectroscopic ellipsometry system configured to modulate the electrical and optical properties of a measurement target and measure structural parameters characterizing the measurement target based on changes in measurement signal values and estimated changes in optical properties of the measurement target.

FIG. 3 is a diagram illustrative of a spectroscopic ellipsometry system configured to modulate the electrical and optical properties of a measurement target and measure structural parameters characterizing the measurement target based on changes in measurement signal values and estimated changes in optical properties of the measurement target.

FIG. 3 depicts an exemplary spectroscopic ellipsometer (SE) metrology system 100 for performing derivative SE measurements of one or more metrology targets as described herein. As depicted in FIG. 3, metrology system 100 includes a SE subsystem 105 including an illumination source 110 that generates a beam of SE illumination light 107 incident on wafer 101. In some embodiments, illumination source 110 is a broadband illumination source that emits illumination light in the ultraviolet, visible, and infrared spectra. In one embodiment, illumination source 110 is a laser sustained plasma (LSP) light source (a.k.a., laser driven plasma source). The pump laser of the LSP light source may be continuous wave or pulsed. Illumination source 110 can be a single light source or a combination of a plurality of broadband or discrete wavelength light sources. The light generated by illumination source 110 includes a continuous spectrum or parts of a continuous spectrum, from ultraviolet to infrared (e.g., vacuum ultraviolet to mid infrared). In general, illumination light source 110 may include a super continuum laser source, an infrared helium-neon laser source, an arc lamp, a globar source, or any other suitable light source.

In some embodiments, the amount of SE illumination light is broadband illumination light that includes a range of wavelengths spanning at least 500 nanometers. In one example, the broadband SE illumination light includes wavelengths below 250 nanometers and wavelengths above 750 nanometers. In general, the broadband SE illumination light includes wavelengths between 120 nanometers and 4,200 nanometers. In some embodiments, broadband illumination light including wavelengths beyond 4,200 nanometers may be employed. In some embodiments, illumination source 110 includes a deuterium source emitting light with wavelengths across a range from 150 nanometers to 400 nanometers, a LSP source emitting light with wavelengths across a range from 180 nanometers to 2,500 nanometers, a supercontinuum source emitting light with wavelengths across a range from 400 nanometers to 4,200 nanometers, and a globar source emitting light with wavelengths across a range from 2,000 nanometers to 20,000 nanometers.

As depicted in FIG. 3, SE subsystem 105 includes an SE illumination subsystem configured to direct SE illumination light 107 to one or more structures formed on the wafer 101. The SE illumination subsystem is shown to include light source 110, illumination optics 111A, one or more optical filters 111B, polarizing component 112, illumination field stop 113, and illumination pupil aperture stop 114. As depicted, in FIG. 3, the beam of SE illumination light 107 passes through illumination optics 111A, optical filter(s) 111B, polarizing component 112, field stop 113, and aperture stop 114 as the beam propagates from the illumination source 110 to wafer 101. SE illumination light 107 illuminates a portion of wafer 101 over a measurement spot 108.

The illumination optics 111A conditions illumination light 107 and focuses SE illumination light 107 on measurement spot 108. The one or more optical filters 111B are used to control light level, spectral output, or combinations thereof, from the illumination subsystem. In some examples, one or more multi-zone filters are employed as optical filters 111B. Polarizing component 112 generates the desired polarization state exiting the illumination subsystem. In some embodiments, the polarizing component is a polarizer, a compensator, or both, and may include any suitable commercially available polarizing component. The polarizing component can be fixed, rotatable to different fixed positions, or continuously rotating. Although the SE illumination subsystem depicted in FIG. 3 includes one polarizing component, the SE illumination subsystem may include more than one polarizing component. Field stop 113 controls the field of view (FOV) of the SE illumination subsystem and may include any suitable commercially available field stop. Aperture stop 114 controls the numerical aperture (NA) of the SE illumination subsystem and may include any suitable commercially available aperture stop. The SE illumination subsystem may include any type and arrangement of illumination optics 111A, optical filter(s) 111B, polarizing component 112, field stop 113, and aperture stop 114 known in the art of spectroscopic ellipsometry.

Metrology system 100 also includes a collection optics subsystem configured to collect light generated by the interaction between the one or more structures and the incident SE illumination light 107. A beam of collected light 109 is collected from measurement spot 108 by collection optics 115. Collected light 109 passes through collection aperture stop 116, polarizing element 117, and field stop 118 of the collection optics subsystem.

Collection optics 115 includes any suitable optical elements to collect light from the one or more structures formed on wafer 101. Collection aperture stop 116 controls the NA of the collection optics subsystem. Polarizing element 117 analyzes the desired polarization state. The polarizing element 117 is a polarizer or a compensator. The polarizing element 117 can be fixed, rotatable to different fixed positions, or continuously rotating. Although the collection subsystem depicted in FIG. 3 includes one polarizing element, the collection subsystem may include more than one polarizing element. Collection field stop 118 controls the FOV of the collection subsystem. The collection subsystem takes light from wafer 101 and directs the light through collection optics 115, aperture stop 116, and polarizing element 117 to be focused on collection field stop 118. In some embodiments, collection field stop 118 is used as a spectrometer slit for the spectrometers of the detection subsystem. However, collection field stop 118 may be located at or near a separate spectrometer slit of the spectrometers of the detection subsystem. The collection subsystem may include any type and arrangement of collection optics 115, aperture stop 116, polarizing element 117, and field stop 118 known in the art of spectroscopic ellipsometry.

As depicted in FIG. 3, SE metrology system 100 includes a pump illumination source 150 that generates pump illumination light 151 directed to measurement spot 108 on wafer 101. The pump illumination light 151 is coincident with the SE illumination light 107 projected onto the surface of a wafer under measurement over measurement spot 108. In this manner, the optical properties of the structures measured by SE illumination light 107 are modulated by the incident pump illumination light 151 at measurement spot 108. As depicted in FIG. 3, command signal 152 is communicated to the pump illumination light source 150 depicted in FIG. 3. Command signal 152 includes parameters required to characterize the desired pump illumination light 151. By way of non-limiting example, command signal 152 includes the desired photon energy of pump illumination light 151, the desired power density of the pump illumination light 151, the desired modulation frequency of the pump illumination light 151, the desired waveform of the power of the pump illumination light 151, etc. In response, pump illumination light source 150 generates pump illumination light 151 in accordance with the desired characteristics specified by command signal 152.

In general, the illumination power of the SE illumination light 151 incident a measurement spot 108 may vary between different illumination power levels in any periodic or non-periodic manner. In some examples, the illumination light is varied in a binary manner, e.g., on/off, in accordance with a sinusoid between different illumination power levels, in accordance with a square wave between different illumination power levels, etc. In this manner, the reflectance, transmission, or polarization of the measured structure alternates between the signal values in the absence of external perturbation of the optical properties and the signal values in the presence of the perturbation of the optical properties of the structure under measurement.

In the embodiment depicted in FIG. 3, the collection optics subsystem directs light to detector 119. Detector 119 generates output responsive to light collected from the one or more structures illuminated by the SE illumination subsystem at measurement spot 108. In one example, detector 119 includes charge coupled devices (CCD) sensitive to ultraviolet and visible light (e.g., light having wavelengths between 190 nanometers and 860 nanometers). In other examples, detector 119 includes a photo detector array (PDA) sensitive to infrared light (e.g., light having wavelengths between 950 nanometers and 2500 nanometers). However, in general, detector 119 may include other detector technologies and arrangements (e.g., a position sensitive detector (PSD), an infrared detector, a photovoltaic detector, a quadrature cell detector, a camera, etc.). Each detector converts the incident light into electrical signals indicative of the spectral intensity of the incident light. In general, detector 119 generates SE measurement signals 103 indicative of the light detected on detector 119.

Figure 5:
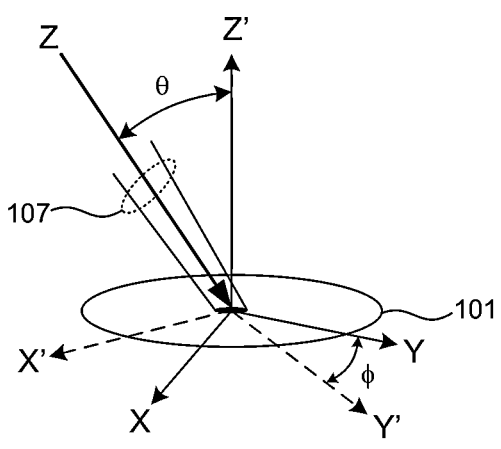
FIG. 5 is a diagram illustrative of an illumination beam incident on a wafer at a particular orientation described by an angle of incidence, θ, and an azimuth angle, φ.

Each orientation of the SE illumination beam 107 relative to the surface normal of semiconductor wafer 101 is described by any two angular rotations of wafer 101 with respect to the illumination beam 107, or vice-versa. In one example, the orientation can be described with respect to a coordinate system fixed to the wafer. FIG. 5 depicts SE illumination beam 107 incident on wafer 101 at a particular orientation described by an angle of incidence, $\theta$, and an azimuth angle, $\phi$. Coordinate frame XYZ is fixed to the SE metrology system (e.g., SE illumination beam 107) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 5, SE illumination beam 107 is aligned with the Z-axis and thus lies within the XZ plane. Angle of incidence, $\theta$, describes the orientation of the SE illumination beam 107 with respect to the surface normal of the wafer in the XZ plane. Furthermore, azimuth angle, $\phi$, describes the orientation of the XZ plane with respect to the X'Z' plane. Together, $\theta$ and $\phi$, uniquely define the orientation of the SE illumination beam 107 with respect to the surface of wafer 101. In this example, the orientation of the SE illumination beam with respect to the surface of wafer 101 is described by a rotation about an axis normal to the surface of wafer 101 (i.e., Z' axis) and a rotation about an axis aligned with the surface of wafer 101 (i.e., Y axis).

As illustrated in FIG. 3, SE metrology tool 100 includes a specimen positioning system 190 configured to both align specimen 101 and orient specimen 101 over a large range of angles of incidence and azimuth angle with respect the illumination beam 107. In this manner, measurements of specimen 101 are collected by metrology system 100 over any number of locations and orientations on the surface of specimen 101. In one example, computing system 130 communicates command signals (not shown) to specimen positioning system 190 that indicate the desired position of specimen 101. In response, specimen positioning system 190 generates command signals to the various actuators of specimen positioning system 190 to achieve the desired positioning of specimen 101.

In general, specimen positioning system 190 may include any suitable combination of mechanical elements to achieve the desired linear and angular positioning performance, including, but not limited to goniometer stages, hexapod stages, angular stages, and linear stages.

In general, an optical scatterometer, such as SE metrology system 100 is configured to deliver illumination light to a metrology target under measurement at any desired angle of incidence and azimuth angle.

The optical properties of the structures illuminated by the pump illumination light 151 are modulated at the same frequency as the pump illumination light 151. To capture the induced changes in the SE measurement signals, the spectra must be collected quickly, i.e., at a frequency at least twice the frequency of modulation of the pump illumination light to avoid losing signal information. Moreover, the modulated SE measurement signal, $\Delta$SE, is relatively small compared to the unmodulated SE measurement signal, SE. Thus, the SE measurement signal may be dominated by optical and electrical noise. Fortunately, the modulated SE signal is present at a known frequency and may be detected using any suitable lock-in detection scheme. Lock-in detection detects the portion of the signal at the known modulation frequency or set of frequencies and discriminates against portions of the signal at other frequencies. Phase-sensitive detection and lock-in amplification are common signal extraction techniques that may be employed to recover the modulated SE measurement signal from the detected measurement signals 103.

Extraction of the modulated SE measurement signal using phase-sensitive lock-in amplification, for example, requires at least one measurement at each wavelength over a time interval including an instance when the pump laser beam is present and an instance when the pump laser beam is not present. Serial detection at each wavelength with a lock-in amplifier leads to long measurement times because the measurements over the desired range of wavelengths are performed sequentially over time.

In some embodiments, signal multiplexing is employed to measure multiple wavelengths simultaneously to reduce signal acquisition time. During each period of the modulation, the detection system simultaneously measures each dispersed beam with a multiplexed readout of signals from the detectors. Furthermore, the detection system calculates the modulated SE signal from the signals at each wavelength.

Collected light is spatially dispersed across a detector array according to wavelength. Light from each narrow band of wavelengths is incident on a different pixel of the detector array. The detected light signal at each narrow band of wavelengths is measured simultaneously by a multiplexed readout of the pixels.

The electronics subsystem of the detector reads the modulated SE signal as well as the unmodulated SE signal from each pixel of the detector array in rapid succession. Multiple measurements of the modulated signal are made within a single period of the modulation cycle. In this manner, the detector enables simultaneous measurement of the SE measurement signal at all desired wavelengths in parallel.

In general, the detected SE measurement signals depend on the configuration of the SE subsystem. In some embodiments, the detected SE measurement signals are SE harmonic signals, e.g., $\{\alpha,\beta\}$, $\{\psi, \Delta\}$, etc. In some embodiments the detected SE measurement signals are one or more elements of the Mueller Matrix representation of the SE measurement. In general, any detected SE measurement signal sensitive to changes in optical properties due to modulated pump illumination light 151 may be contemplated within the scope of this patent document.

Metrology system 100 also includes computing system 130 configured as a derivative based measurement engine 160 configured to estimated values of one or more parameters of interest characterizing a structure under measurement based on changes in measurement signal values and estimated changes in optical properties of the structure induced by modulation of the electrical and optical properties of the structure.

Figure 4:
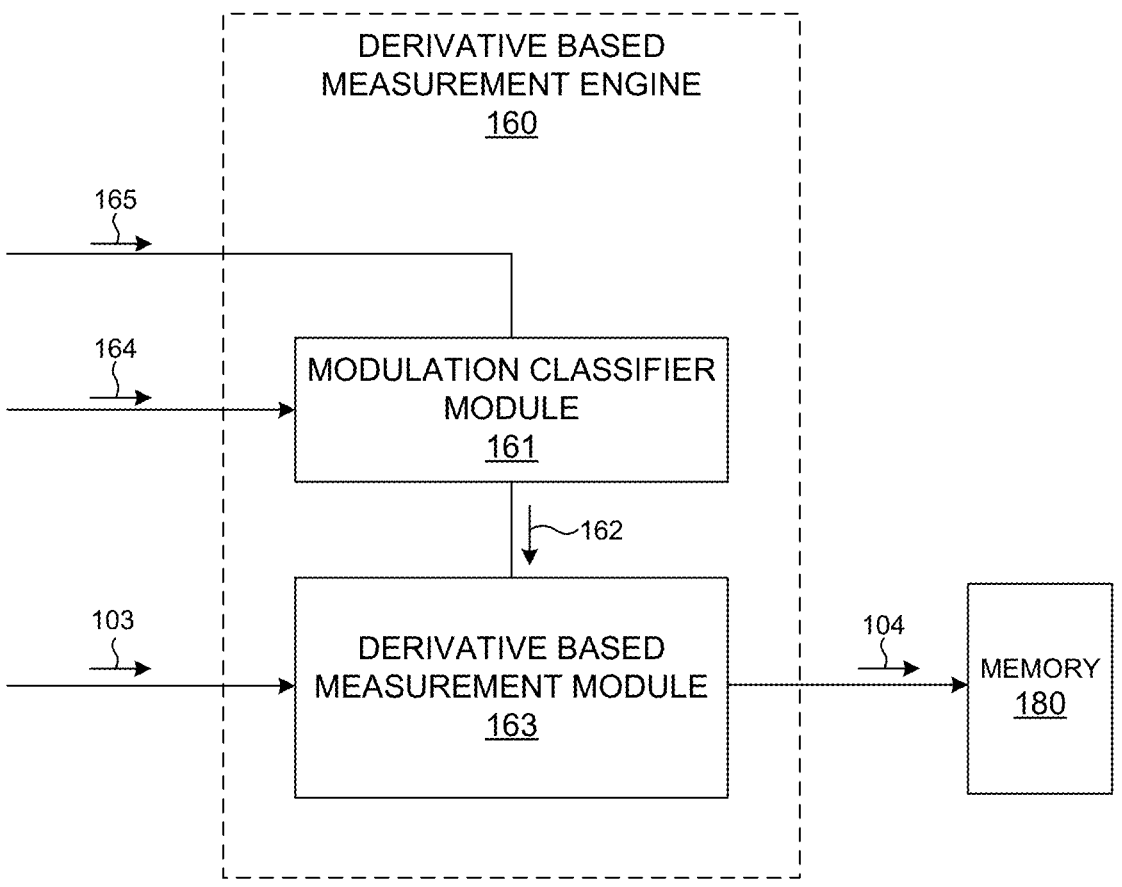
FIG. 4 is a diagram illustrative of derivative based measurement engine 160 in one embodiment.

FIG. 4 is a diagram illustrative of derivative based measurement engine 160 in one embodiment. As depicted in FIG. 4, derivative based measurement engine 160 includes a modulation classifier module 161 and a derivative based measurement module 163. A signal 165 indicative of the properties of the pump illumination light 151 directed to the measurement spot 108 is communicated to modulation classifier 161. In one example, signal 165 is the command signal 152 communicated to pump illumination light source 150 depicted in FIG. 3. In this example, signal 165 includes the desired photon energy of pump illumination light 151 and the desired power density of the pump illumination light 151. In another example, signal 165 is generated by one or more optical sensors (not shown) disposed in the optical path between pump illumination light source 150 and wafer 101. In this example, signal 165 includes an indication of the photon energy of pump illumination light 151 and the power density of the pump illumination light 151 measured by the optical sensors. In addition, a signal 164 indicative of the materials comprising the structure under measurement is communicated to modulation classifier module 161.

In response to signals 164 and 165, modulation classifier module 161 generates a signal 162 indicative of the induced changes in optical properties of the structure under measurement, e.g., $\{\Delta n, \Delta k\}$, due to the pump illumination light 151 incident on the structure under measurement. In some examples, modulation classifier module 161 includes a library database characterizing the changes in optical properties of various materials employed in semiconductor manufacturing induced by illumination at different photon energy and beam power density levels. In some other examples, modulation classifier module 161 includes a model characterizing the changes in optical properties of various materials employed in semiconductor manufacturing induced by illumination at different photon energy and beam power density levels.

The changes in optical properties of semiconductor materials depend on photon energy and beam power density, but are expected to be independent of geometry. In some examples, single layer film samples are prepared each including a layer of each different material. The optical properties, e.g., {n, k}, are measured using conventional SE measurements while illuminated by pump illumination light at a number of different photon energy levels and beam power density levels. The measured optical properties are compared to the measured values of the optical properties in the absence of any pump illumination. The difference between the measured optical properties at the specified pump illumination levels and the measured optical properties in the absence of pump illumination is the induced change in optical properties, e.g., {Δn, Δk}, at each of the specified pump illumination levels. In some embodiments, these calibrated values are entered into a database and interpolated to specify the induced change in optical properties for any specified pump illumination level. In these embodiments, modulation classifier module 161 includes the database. In some other embodiments, the calibrated values are fit to a model that specifies the induced change in optical properties for any specified pump illumination level. In these embodiments, modulation classifier module 161 includes the trained model.

In some examples, one or more metrology targets are disposed at a different location on the same semiconductor wafer as the structure under measurement. Each metrology target includes a single film layer corresponding to each of the different materials comprising the structure under measurement. The change in value of the one or more electrical or optical properties of each metrology target induced by the variation of power of the pump illumination light is measured. The variation of power of the pump illumination light employed to measure each single film layer metrology target is the same as the variation of power of the pump illumination light employed to measure the structure under measurement. In this manner, the measured change in value of the one or more electrical or optical properties of each metrology target is directly applicable to the model based measurement of the structure under measurement.

As depicted in FIG. 4, signal 162 indicative of the values of the induced changes in optical properties of the structure under measurement, e.g., {Δn, Δk}, is communicated to derivative based measurement module 162. In one example, signal 162 includes two vectors. One vector expresses the induced change in the index of refraction, Δn, as a function of wavelength, and the other vector expresses the induced change in the absorption coefficient, Δk, as a function of wavelength. In addition, SE measurement signals 103 are communicated to derivative based measurement module 163. The SE measurement signals vary due to the perturbation of the optical properties of the structure under measurement induced by the modulated pump illumination light 151. In some examples, the SE measurement signals include one or more elements of the Mueller Matrix. In these examples, the changes in value of the one or more elements of the Mueller Matrix induced by the modulation are provided as input to the measurement model. In some examples, the SE measurement signals are the harmonic signals generated by the spectrometer. In these examples, the changes in value of the harmonic signals induced by the modulation are provided as input to the measurement model.

Derivative based measurement module 163 includes a derivative based model that estimates values of one or more parameters of interest characterizing the structure under measurement based on the changes in SE measurement signals and the values of the induced changes in optical properties of the structure under measurement, e.g., {Δn, Δk}.

In some embodiments, the derivative based measurement model is a trained, machine-learning (ML) based model. The ML based model is trained using Design Of Experiments (DOE) data sets associated with DOE measurement targets having known values of the parameters of interest. The DOE data sets include changes in SE measurement signals and the values of the induced changes in optical properties of the structure under measurement, e.g., {Δn, Δk}, associated with DOE measurements of the DOE measurement targets. In some examples, the DOE measurements are actual SE measurements of DOE measurement targets having known values of parameters of interest. In some of these examples, the known values of the parameters of interest are obtained by measurement using a trusted reference metrology system. In some other examples, the DOE measurements are simulated SE measurements of simulated DOE measurement targets having programmed values of the parameters of interest.

In some embodiments, the derivative based measurement model is a physics based model that relates the values of the induced changes in optical properties of the structure under measurement, e.g., {Δn, Δk} and assumed values of parameters of interest to predicted normalized changes in SE measurement signals, e.g., $(\Delta SE/SE)^*$. The assumed values of the parameters of interest are updated as part of regression process until a sufficiently good fit is obtained between the predicted normalized changes in the SE measurement signals and the actual normalized changes in the SE measurement signals, e.g., $(\Delta SE/SE)$. When a sufficiently good fit is obtained, the estimated values of the parameters of interest are communicated to a memory, e.g., memory 180.

The normalized changes in the SE measurement signals 103 define the change in any spectroscopic ellipsometry signal as illustrated in Equation (3), where $SE_{ON}$ are the SE measurement signal values when the power of pump illumination light 151 is maximal, and $SE_{OFF}$ are the SE measurement signal values when the power of pump illumination light 151 is minimal, e.g., zero.

$$\frac{\Delta SE}{SE} = \frac{SE_{ON} - SE_{Off}}{SE_{Off}} \tag{3}$$

As described hereinbefore, the SE signals include any suitable SE signal generated by a spectrometer of the SE measurement system, e.g., harmonic signals, one or more Mueller Matrix elements, etc.

The dielectric function, ε, of a material is characterized by a complex function having real, $\varepsilon_1$, and imaginary, $\varepsilon_2$, coefficients as illustrated by Equation (4).

$$\varepsilon = \varepsilon_1 + i\varepsilon_2 \tag{4}$$

The predicted normalized changes in the SE signal are related to the perturbation of the dielectric function induced by the pump illumination light as illustrated by Equation (5), where $a(\varepsilon 1, \varepsilon 2)$ and $b(\varepsilon 1, \varepsilon 2)$ are two coefficients related to the dielectric function.

$$\left(\frac{\Delta SE}{SE}\right)^* = a(\varepsilon_1, \varepsilon_2)\Delta\varepsilon_1 + b(\varepsilon_1, \varepsilon_2)\Delta\varepsilon_2 \tag{5}$$

Coefficients $a(\varepsilon_1, \varepsilon_2)$ and $b(\varepsilon_1, \varepsilon_2)$ depend on both the material and geometry of the structure under optical modulation. However, the perturbations of the dielectric function coefficients, $\Delta\varepsilon_1$ and $\Delta\varepsilon_2$ are related by the Kramers-Kronig relations and are independent of the geometry of the structure under measurement. For this reason, these perturbations can be determined based on the known material and known properties of the pump illumination light 151 using modulation classifier module 161 as described hereinbefore.

Equation (5) relates the predicted normalized changes in the SE signal to the perturbation of the dielectric function for the case where the optical properties of a single material are perturbed by the pump illumination light 151. Equation (6) illustrates the relationship between the predicted normalized changes in the SE signal to the perturbation of the dielectric function for the case where the optical properties of d different materials are perturbed by the pump illumination light 151.

$$\left(\frac{\Delta SE}{SE}\right)^* = \sum_{j=1}^{d} a_j(\varepsilon_1^j, \varepsilon_2^j)\Delta\varepsilon_1^j + b_j(\varepsilon_1^j, \varepsilon_2^j)\Delta\varepsilon_2^j \tag{6}$$

In the example illustrated in Equation (6), a structure under measurement includes d different material layers having optical properties subject to modulation by pump illumination light 151. In one example, a Lorentz model of the dielectric function of a grating structure including d material layers is assumed. In this example, Equation (6) may be rewritten as illustrated by Equation (7), where d is the number of different modulated materials having bandgap energy below the modulation photon energy, Aj is a dimensionless amplitude that is a function of the photon energy of the pump illumination light and the material geometry, e.g., CD and HT, $\Gamma j$ is a broadening parameter expressed in electronvolts, $\theta j$ is a lineshape phase parameter expressed in radians, Ej is the transition energy expressed in electronvolts, and m is a parameter related to the dimensionality of the transition. The value of m is 3 in the case of Silicon.

$$\left(\frac{\Delta SE}{SE}\right)^* = \sum_{j=1}^{d} \text{Re}\left[A_j(E, CD, HT)e^{i\theta_j}(E - E_j + i\Gamma_j)^{-m}\right] \tag{7}$$

Equation [7] is an approximated form of the derivative of the SE measurement signal under the Lorentz model assumption of the dielectric function.

The perturbation of the dielectric function may be expressed in terms of the perturbation of the refractive index and the extinction coefficients as illustrated by Equation (8), where $\Delta n$ is the change in the refractive index, $\Delta k$ is the change in the extinction coefficient, and I is the intensity of the harmonic oscillator.

$$\Delta\varepsilon = \tag{8}$$

$$\left(\frac{\partial\varepsilon}{\partial E_g}\frac{\partial E_g}{\partial n} + \frac{\partial\varepsilon}{\partial\Gamma}\frac{\partial\Gamma}{\partial n} + \frac{\partial\varepsilon}{\partial I}\frac{\partial I}{\partial n}\right)\Delta n + \left(\frac{\partial\varepsilon}{\partial E_g}\frac{\partial E_g}{\partial k} + \frac{\partial\varepsilon}{\partial\Gamma}\frac{\partial\Gamma}{\partial k} + \frac{\partial\varepsilon}{\partial I}\frac{\partial I}{\partial k}\right)\Delta k$$

Equation (8) can be rewritten as illustrated by Equations (9)-(12).

$$\Delta\varepsilon_i = \left[\left(A_{En}f_E^i + A_{\Gamma n}f_\Gamma^i + A_{In}f_I^i\right)\Delta n + \left(A_{Ek}f_E^i + A_{\Gamma k}f_\Gamma^i + A_{Ik}f_I^i\right)\Delta k\right](1/\Gamma), \tag{9}$$

$$i = 1, 2$$

where $$A_{En} = \frac{1}{\Gamma}\frac{\partial E_g}{\partial n}, A_{\Gamma n} = \frac{1}{\Gamma}\frac{\partial\Gamma}{\partial n}, A_{In} = \frac{1}{\Gamma}\frac{\partial I}{\partial n}; \tag{10}$$

$$A_{Ek} = \frac{1}{\Gamma}\frac{\partial E_g}{\partial k}, A_{\Gamma k} = \frac{1}{\Gamma}\frac{\partial\Gamma}{\partial k}, A_{Ik} = \frac{1}{\Gamma}\frac{\partial I}{\partial k}; \text{ and} \tag{11}$$

$$f_E^i = \frac{\partial\varepsilon_i}{\partial E_g}, f_\Gamma^i = \frac{\partial\varepsilon_i}{\partial\Gamma}, f_I^i = \frac{\partial\varepsilon_i}{\partial I} \tag{12}$$

The values of the elements of Equations (10)-(12) are known for many semiconductor materials. The unperturbed dielectric function may be expressed in many different forms depending on the material, thickness, confinement effect, crystalline degree, temperature. etc. The most common assumptions are Lorentzian or Gaussian. The Lorentzian dielectric function is illustrated by Equation (13).

$$\varepsilon = 1 + \frac{I}{E - E_g + i\Gamma} \tag{13}$$

Under the assumed form illustrated by Equation (13), the modulation terms of equation (12) may be expressed as illustrated by Equations (14)-(15), where $y = (E-E_g)/\Gamma$.

$$f_E^1 = \frac{y^2 - 1}{\left(y^2 + 1\right)^2}, f_\Gamma^1 = f_E^2, f_I^1 = \frac{y}{\left(y^2 + 1\right)} \tag{14}$$

$$f_E^2 = \frac{-2y}{\left(y^2 + 1\right)}, f_\Gamma^2 = -f_E^2, f_I^2 = \frac{-1}{\left(y^2 + 1\right)} \tag{15}$$

Assuming the intensity modulation is negligible, using equations (10) to (15) in (8), we arrive at a general form of the derivative spectra under measurement.

In general, there are multiple models that describe the dielectric function. Although a Lorentz model is described hereinbefore, in general, any suitable model of the dielectric function is contemplated within the scope of this patent document.

In general, the SE metrology system described with reference to FIG. 3 may be any form of a spectroscopic ellipsometer including, but not limited to, a rotating compensator SE system, a rotating polarizer SE system, a rotating polarizer, rotating compensator SE system, a rotating compensator, rotating compensator SE system, etc. In addition, the derivative based measurement techniques may be applied to other ellipsometric systems that employ non-rotating, solid state devices such as photo-elastic modulators to measure all or a portion of the sample Mueller matrix.

In general, the electrical properties of a measurement target are perturbed by inducing changes in an electric field within the measurement target under measurement, which, in turn, changes the optical properties of the measurement target. As described hereinbefore, the changes in the electric field are induced by directing a modulated beam of illumination light at the measurement target under measurement. However, in general, any suitable technique for changing the electric field is contemplated within the scope of this patent document. In some embodiments, a wafer is located between two electrodes and a time varying bias voltage is applied across the electrodes. The time varying bias voltage induces a modulation of the electric field within the wafer, including the measurement target. This electrical modulation induces modulation of electrical and optical properties of the measurement target under measurement, which is exploited for measurement purposes as described hereinbefore.

The methods and systems described herein enable improved measurements of structural elements common in semiconductor manufacturing, e.g., material composition, alloy fraction measurements of compound semiconductors, material band gap, characterization of semiconductor surfaces and interfaces, film layer properties, critical dimensions, etc. Measurement applications include measurements of structural elements comprising complex semiconductor structures such as 3D VNAND structures and Gate-All-Around (GAA) structures, including front-end-of-line (FEOL) layers from oxide definition layers to high-k metal gate (HKMG) stacks. Measurement applications include measurements of structural elements comprised of semiconducting materials, insulating dielectric materials, and conducting materials, including organic materials, inorganic materials, or a combination thereof.

In general, the modulation wavelength and power density of the pump illumination light are selected for each measurement application to improve sensitivity and reduce correlations.

As described hereinbefore, the measurement of ONO thin film stacks is improved by employing illumination pump light with photon energy greater than 4.5 electronvolts. In some embodiments, a 244 nanometer solid-state, continuous laser is employed as a pump illumination source to enhance the measurement of ONO thin film stacks.

In some examples, a pump illumination source generating pump illumination light with photon energy below the bandgap of silicon, i.e., 1.12 electronvolts, is employed to measure Silicon/Silicon Germanium superlattice structures.

In other examples, a pump illumination source generating pump illumination light with photon energy between the bandgaps of Hafnium Oxide (HfO2) and Silicon Oxide (SiO$_2$) is employed to measure High-k/Interfacial Layer (HK/IL) gate stacks.

In general, the techniques to break correlations among various contributors to the measured optical response described herein may be combined to improve the accuracy of measurements of complex semiconductor structures. For example, derivative based measurements of structures at various wavelengths, angles of incidence, azimuth angles, or any combination thereof can be analyzed sequentially or in parallel to accurately decorrelate structural features associated with complex multi-layer structures.

In a further aspect, the wavelengths emitted by the measurement illumination source, e.g., illumination source 110, the pump illumination source, e.g., illumination source 150, are selectable. In some embodiments, illumination source 110 or illumination source 150 is a LSP light source controlled by computing system 130 to maximize flux in one or more selected spectral regions. Laser peak intensity at the target material controls the plasma temperature and thus the spectral region of emitted radiation. Laser peak intensity is varied by adjusting pulse energy, pulse width, or both. As depicted in FIG. 3, computing system 130 communicates command signal 140 to illumination source 110 that causes illumination source 110 to adjust the spectral range of wavelengths emitted from illumination source 110. Similarly, computing system 130 communicates command signal 152 to illumination source 150 that causes illumination source 150 to adjust the spectral range of wavelengths emitted from illumination source 150. In one example, illumination source 110 is a LSP light source and the LSP light source adjusts any of a pulse duration, pulse frequency, and target material composition to realize a desired spectral range of wavelengths emitted from the LSP light source. In another example, illumination source 150 is a tunable laser based light source, e.g., a tunable, supercontinuum laser light source, and the laser light source adjusts one or more operational parameters of the laser light source to realize a desired spectral range of wavelengths emitted from the laser based light source.

In some examples, the derivative based measurement engine 160 reads a file that contains the equations describing the shape and composition of the structure under measurement. In some examples, this file is generated by a lithography simulator such as PROLITH software available from KLA Corporation, Milpitas, California (USA). Based on this application information the derivative based measurement engine automatically sets the parameterization and constraints of the structural model.

Although the methods discussed herein are explained with reference to system 100, any optical or x-ray based metrology system configured to illuminate and detect light scattered from a specimen may be employed to implement the exemplary methods described herein. Furthermore, any electron based metrology system configured to illuminate and detect scattered electrons from a specimen may be employed to implement the exemplary methods described herein. Exemplary systems include an angle-resolved reflectometer (i.e., a beam profile reflectometer), an angle-resolved ellipsometer (i.e., beam profile ellipsometer), a scatterometer, a spectroscopic reflectometer or ellipsometer, a spectroscopic reflectometer or ellipsometer with multiple angles of illumination, a Mueller Matrix spectroscopic ellipsometer (e.g., a rotating compensator spectroscopic ellipsometer), a single wavelength ellipsometer, a single wavelength reflectometer, a RAMAN scatterometer, a transmission, small-angle x-ray scatterometer, a reflective, small-angle x-ray scatterometer, a grazing incidence, small-angle x-ray scatterometer, a transmission electron microscope, a scanning electron microscope, etc.

By way of non-limiting example, an ellipsometer may include a single rotating compensator, multiple rotating compensators, a rotating polarizer, a rotating analyzer, a modulating element, multiple modulating elements, or no modulating element.

It is noted that the output from a source and/or target measurement system may be configured in such a way that the measurement system uses more than one technology. In fact, an application may be configured to employ any combination of available metrology sub-systems within a single tool, or across a number of different tools.

A system implementing the methods described herein may also be configured in a number of different ways. For example, a wide range of wavelengths (including visible, ultraviolet, and infrared), angles of incidence, states of polarization, and states of coherence may be contemplated. In another example, the system may include any of a number of different light sources (e.g., a directly coupled light source, a laser-sustained plasma light source, etc.). In another example, the system may include elements to condition light directed to or collected from the specimen (e.g., apodizers, filters, etc.).

In general, the optical dispersion properties of semiconductor structures under measurement may be approximated as isotropic. Under this assumption the material parameters are scalar values. Alternatively, the optical dispersion properties of semiconductor structures under measurement may be more accurately modelled as anisotropic. Under this assumption, the material parameters will be a matrix of different values, rather than a scalar value. Additional details regarding the treatment of anisotropic structures under measurement is described in U.S. Patent Publication No. 2018/0059019, the content of which is incorporated herein by reference in its entirety.

Figure 6:
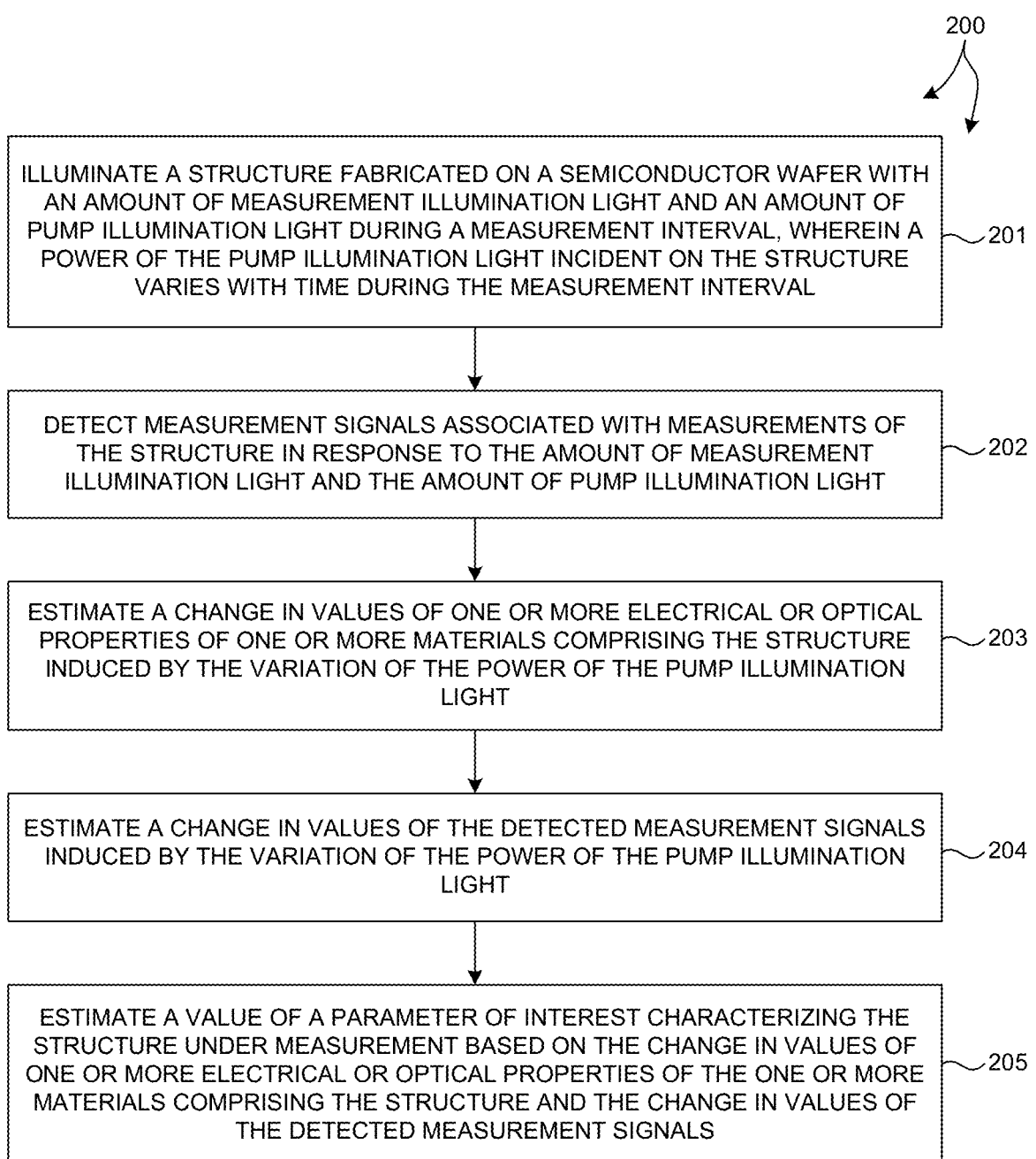
FIG. 6 is a flowchart illustrative of a method 200 for measuring structural parameters characterizing a measurement target based on changes in measurement signal values and estimated changes in optical properties of the measurement target as described herein.

FIG. 6 illustrates a method 200 suitable for implementation by the metrology system 100 of the present invention. In one aspect, it is recognized that data processing blocks of method 200 may be carried out via a pre-programmed algorithm executed by one or more processors of computing system 130. While the following description is presented in the context of metrology system 100, it is recognized herein that the particular structural aspects of metrology system 100 do not represent limitations and should be interpreted as illustrative only.

In block 201, a structure fabricated on a semiconductor wafer is illuminated with an amount of measurement illumination light and an amount of pump illumination light during a measurement interval. The power of the pump illumination light incident on the structure varies with time during the measurement interval.

In block 202, measurement signals associated with measurements of the structure are detected in response to the amount of measurement illumination light and the amount of pump illumination light.

In block 203, a change in values of one or more electrical or optical properties of one or more materials comprising the structure is estimated. The change in values is induced by the variation of the power of the pump illumination light.

In block 204, a change in values of the detected measurement signals induced by the variation of the power of the pump illumination light is estimated.

In block 205, a value of a parameter of interest characterizing the structure under measurement is estimated based on the change in values of one or more electrical or optical properties of the one or more materials comprising the structure and the change in values of the detected measurement signals.

It should be recognized that the various steps described throughout the present disclosure may be carried out by a single computer system, or, alternatively, multiple computer systems. Moreover, different subsystems, such as the spectroscopic ellipsometer 105, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

The computing system 130 may include, but is not limited to, a personal computer system, mainframe computer system, workstation, image computer, parallel processor, or any other computing device known in the art. In general, the term "computing system" may be broadly defined to encompass any device having one or more processors, which execute instructions from a memory medium. In general, computing system 130 may be integrated with a measurement system such as measurement system 100, or alternatively, may be separate from any measurement system. In this sense, computing system 130 may be remotely located and receive measurement data and user input from any measurement source and user input source, respectively.

Program instructions 134 implementing methods such as those described herein may be transmitted over or stored on carrier medium. The carrier medium may be a transmission medium such as a wire, cable, or wireless transmission link. The carrier medium may also include a computer-readable medium such as a read-only memory, a random access memory, a magnetic or optical disk, or a magnetic tape. For example, as illustrated in FIG. 3, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, trench depth, etc.), a critical dimension between any two or more structures (e.g., distance between two structures), a displacement between two or more structures (e.g., overlay displacement between overlaying grating structures, etc.), and a dispersion property value of a material used in the structure or part of the structure. Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect. However, such terms of art do not limit the scope of the term "metrology system" as described herein. The metrology system may be configured as a LED inspection tool, edge inspection tool, backside inspection tool, macro-inspection tool, or multi-mode inspection tool (involving data from one or more platforms simultaneously), and any other metrology or inspection tool.

Various embodiments are described herein for a semiconductor processing system (e.g., an inspection system or a lithography system) that may be used for processing a specimen. The term "specimen" is used herein to refer to a site, or sites, on a wafer, a reticle, or any other sample that may be processed (e.g., printed, measured, or inspected for defects) by means known in the art. In some examples, the specimen includes a single site having one or more measurement targets whose simultaneous, combined measurement is treated as a single specimen measurement or reference measurement. In some other examples, the specimen is an aggregation of sites where the measurement data associated with the aggregated measurement site is a statistical aggregation of data associated with each of the multiple sites. Moreover, each of these multiple sites may include one or more measurement targets associated with a specimen or reference measurement.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
   an illumination subsystem configured to illuminate a structure fabricated on a semiconductor wafer with an amount of measurement illumination light during a measurement interval;
   a pump illumination subsystem configured to illuminate the structure with an amount of pump illumination light during the measurement interval, wherein a power of the pump illumination light incident on the structure varies with time during the measurement interval;
   a detector configured to detect measurement signals associated with measurements of the structure in response to the amount of measurement illumination light and the amount of pump illumination light; and
   a computing system configured to:
      estimate a change in values of one or more electrical or optical properties of one or more materials comprising the structure induced by the variation of the power of the pump illumination light based on one or more properties of the pump illumination light;
      estimate a change in values of the detected measurement signals induced by the variation of the power of the pump illumination light; and
      estimate a value of a parameter of interest characterizing the structure under measurement based on the change in values of one or more electrical or optical properties of the one or more materials comprising the structure and the change in values of the detected measurement signals.

2. The metrology system of claim 1, wherein the estimating of the value of a parameter of interest involves a trained derivative based measurement model.

3. The metrology system of claim 2, wherein the trained derivative based measurement model is a machine learning based model or a physics based model.

4. The metrology system of claim 2, wherein the parameter of interest is any of a critical dimension, a film thickness, or a material property.

5. The metrology system of claim 1, wherein the detected measurement signals are associated with measurements of the structure at multiple wavelengths, multiple angles of incidence, multiple azimuth angles, or any combination thereof.

6. The metrology system of claim 1, wherein a pump illumination source of the pump illumination subsystem is a laser based illumination source having a selectable wavelength output.

7. The metrology system of claim 1, wherein the structure under measurement includes a plurality of different materials, and wherein a photon energy of the pump illumination light is between a first band gap energy of a first of the plurality of materials and a second band gap energy of a second of the plurality of materials, and wherein the first band gap energy is different from the second band gap energy.

8. The metrology system of claim 1, wherein the metrology system is an optically based metrology system, an electron based metrology system, or an x-ray based metrology system.

9. The metrology system of claim 1, wherein the estimating of the change in values of one or more electrical or optical properties of a material of the one or more materials comprising the structure involves a measurement of a change in value of the one or more electrical or optical properties of a metrology target induced by the variation of the power of the pump illumination light, wherein the metrology target is disposed on the semiconductor wafer at a location different from a location of the structure under measurement, and wherein the metrology target includes a single film layer of the material.

10. The metrology system of claim 1, wherein the power of the pump illumination light is varied by mechanical modulation or electronic modulation.

11. The metrology system of claim 10, wherein the modulation is a sinusoidal modulation or a square wave modulation.

12. The metrology system of claim 1, wherein the detected measurement signals are values of one or more Mueller matrix elements, values of one or more harmonic signals, or values of one or more detected image signals.

13. The metrology system of claim 1, wherein the structure under measurement is an array of partially fabricated transistor devices.

14. The metrology system of claim 1, wherein the variation of the power of the pump illumination light is periodic or non-periodic.

15. A method comprising:

illuminating a structure fabricated on a semiconductor wafer with an amount of measurement illumination light and an amount of pump illumination light during a measurement interval, wherein a power of the pump illumination light incident on the structure varies with time during the measurement interval;

detecting measurement signals associated with measurements of the structure in response to the amount of measurement illumination light and the amount of pump illumination light;

estimating a change in values of one or more electrical or optical properties of one or more materials comprising the structure induced by the variation of the power of the pump illumination light based on one or more properties of the pump illumination light;

estimating a change in values of the detected measurement signals induced by the variation of the power of the pump illumination light; and estimating a value of a parameter of interest characterizing the structure under measurement based on the change in values of one or more electrical or optical properties of the one or more materials comprising the structure and the change in values of the detected measurement signals.

16. The method of claim 15, wherein the detected measurement signals are associated with measurements of the structure at multiple wavelengths, multiple angles of incidence, multiple azimuth angles, or any combination thereof.

17. The method of claim 15, wherein the structure under measurement includes a plurality of different materials, and wherein a photon energy of the pump illumination light is between a first band gap energy of a first of the plurality of materials and a second band gap energy of a second of the plurality of materials, and wherein the first band gap energy is different from the second band gap energy.

18. The method of claim 15, wherein the estimating of the change in values of one or more electrical or optical properties of a material of the one or more materials comprising the structure involves a measurement of a change in value of the one or more electrical or optical properties of a metrology target induced by the variation of the power of the pump illumination light, wherein the metrology target is disposed on the semiconductor wafer at a location different from a location of the structure under measurement, and wherein the metrology target includes a single film layer of the material.

19. The method of claim 15, wherein the variation of the power of the pump illumination light is periodic or non-periodic.

20. A metrology system comprising:

an illumination subsystem configured to illuminate a structure fabricated on a semiconductor wafer with an amount of measurement illumination light during a measurement interval;

a pump illumination subsystem configured to illuminate the structure with an amount of pump illumination light during the measurement interval, wherein a power of the pump illumination light incident on the structure varies with time during the measurement interval;

a detector configured to detect measurement signals associated with measurements of the structure in response to the amount of measurement illumination light and the amount of pump illumination light; and a non-transitory, computer-readable medium storing instructions that, when executed by one or more processors, causes the one or more processors to:

estimate a change in values of one or more electrical or optical properties of one or more materials comprising the structure induced by the variation of the power of the pump illumination light based on one or more properties of the pump illumination light;

estimate a change in values of the detected measurement signals induced by the variation of the power of the pump illumination light; and estimate a value of a parameter of interest characterizing the structure under measurement based on the change in values of one or more electrical or optical properties of the one or more materials comprising the structure and the change in values of the detected measurement signals.

* * * * *